United States Patent
Kozak et al.

(10) Patent No.: US 6,894,220 B1
(45) Date of Patent: May 17, 2005

(54) METHODS AND APPARATUS FOR GROUNDING A CIRCUIT BOARD

(75) Inventors: Frederic Michael Kozak, Raleigh, NC (US); Lester Creekmore, Raleigh, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/436,339

(22) Filed: May 12, 2003

(51) Int. Cl.[7] .............................................. H05K 5/02
(52) U.S. Cl. .................... 174/51; 174/16.3; 174/53; 174/36; 174/68.5; 174/255; 174/260; 174/265; 174/524
(58) Field of Search ........................ 174/51, 16.3, 53, 174/36, 68.5, 255, 260, 265, 52.4; 361/761, 762, 764, 795, 704, 707

(56) References Cited

U.S. PATENT DOCUMENTS

| | | | |
|---|---|---|---|
| 4,602,832 A | 7/1986 | Cunningham et al. | 339/14 R |
| 4,675,788 A * | 6/1987 | Breitling et al. | 361/792 |
| 5,617,296 A * | 4/1997 | Melville et al. | 361/736 |
| 5,677,815 A | 10/1997 | Chan | 360/106 |
| 5,929,815 A | 7/1999 | Elderfield | 343/702 |
| 6,093,997 A * | 7/2000 | Zimnicki et al. | 310/352 |
| 6,459,593 B1 * | 10/2002 | Kwong | 361/761 |
| 6,545,562 B2 | 4/2003 | Loeffelholz et al. | 333/100 |
| 6,720,841 B2 | 4/2004 | Loeffelholz et al. | 333/100 |

* cited by examiner

*Primary Examiner*—Dean A. Reichard
*Assistant Examiner*—Anton Harris
(74) *Attorney, Agent, or Firm*—Chapin & Huang, L.L.C.; David E. Huang, Esq.

(57) ABSTRACT

A grounding member support forms an interference or friction fit with an opening defined by a circuit board. A compliant, electrically conductive grounding member couples to the grounding member support. The grounding member electrically couples a grounding layer of the circuit board with a support mount coupled to the circuit board. During assembly, insertion of the grounding member support within the opening defined by the circuit board creates an expansive or lateral force on the opening. Furthermore, during assembly, the support mount compresses the compliant, electrically conductive grounding member against the circuit board. The interference fit between the grounding member support and the opening along with compression of the grounding member between the circuit board and the support mount limits the amount of stress received by a surface of the circuit board. Such limitation of stress, in turn, limits potential damage to components mounted to the circuit board or to conductive layers within the circuit board.

27 Claims, 6 Drawing Sheets

METHODS AND APPARATUS FOR GROUNDING A CIRCUIT BOARD

BACKGROUND OF THE INVENTION

A typical multi-layer circuit board is formed of multiple nonconductive (e.g., fiberglass) and conductive (e.g., copper) layers. The multiple conductive layers carry signals among circuit board components mounted to the circuit board and in contact with the conductive layers.

Certain conductive layers in conventional multi-layer circuit boards include grounding layers (e.g., grounding planes) to ground certain conductive systems associated with the circuit board. For example, conventional multi-layer circuit boards include system ground layers such as a logic ground layer, a frame ground layer (e.g., a ground for a frame attached to the multi-layer circuit board), and a chassis ground layer (e.g., a ground for a chassis carrying the combination of the multi-layer circuit board and frame). The circuit board integrates (e.g. connects) the grounding layers at mesh points along the circuit board to form an integrated grounding of the grounding layers of the circuit board.

Certain conventional multi-layer circuit boards utilize sheets of conductive material, formed into z-shaped clips, to couple the mesh points of the circuit board to a support mount or carrier tray coupled to the circuit board.

Conventional multi-layer circuit boards utilize printed circuit board (PCB) mounting holes as the mesh points for the system grounds. For example, conventional 12"×14" circuit boards have nine PCB mounting holes located in proximity to the perimeter of the circuit board, each of the PCB mounting holes having a diameter of approximately 9.5 mm.

Conventional electrically conductive side portions or stand-offs couple the PCB mounting holes to an electrically conductive support mount or carrier tray. Fasteners, such as screws, secure the circuit board, support mount, and conductive stand-offs together to secure the components and to maintain electrical contact among the components. The fasteners cause the substantially non-compliant (e.g., minimally yielding under stress) stand-offs to generate a relatively large stress on the surface of the circuit board. The stress, in turn, can break or cause failure of circuit board component ball grid arrays (BGA) positioned relatively close to the PCB mounting holes. As a result, the PCB mounting holes require that BGA devices mount to the circuit board at a 0.5 inch radius from the center of each PCB mounting hole to minimize stress on the BGA.

Manufacturers of the multi-layer circuit boards typically space or arrange the PCB mounting holes on the circuit board to minimize ground loops within the circuit board. For example, in conventional multi-layer circuit board, operation of the circuit board components create a potential difference between two adjacent PCB mounting holes in the circuit board and induce a current flow between the PCB mounting holes. Such current generates electromagnetic interference (EMI) radiation that can interfere with operation of the circuit board. By using multiple PCB mounting holes coupled to the circuit board carrier tray, the manufacturer reduces the amount of current induced among the PCB mounting holes on the circuit board and thereby reduces the amount of EMI radiation generated by current flow between the PCB mounting holes.

SUMMARY

Conventional techniques for coupling the ground layers of a multi-layer circuit board to a support mount suffer from a variety of deficiencies.

In circuit boards with integrated grounding, PCB mounting holes provide a mesh location for the system grounds. As described, conventional multi-layer circuit boards utilize printed circuit board (PCB) mounting holes as the mesh points for the system grounds. During operation of the circuit board components create a potential difference between two adjacent PCB mounting holes in the circuit board and induce a current flow between the PCB mounting holes. As the operating frequency of circuit board components or electronics increases, however, to reduce the amount of current induced between PCB mounting holes on the circuit board, the distance between meshing points decreases. The use of conventional circuit having PCB mounting holes located at relatively large distances from each other (e.g., 12"×14" circuit boards having nine PCB mounting holes) with circuit board components having a relatively high operating frequency, therefore, allows induction of current flow between the PCB mounting holes and generation of EMI radiation that can interfere with operation of the circuit board.

For a circuit board having components operating at a relatively high frequency, a manufacturer can minimize the induction of current between adjacent PCB mounting holes by increasing the number of PCB mounting holes within the circuit board. However, conventional PCB mounting holes have a diameter of approximately 9.5 mm. Increasing the number of PCB mounting holes in a circuit board reduces the amount of real estate on the circuit board available for circuit board components and traces.

Also as described above, conventional fasteners and minimally compliant stand-offs generate a stress on the surface of the circuit board after attachment to the PCB mounting holes. The stress, in turn, can fracture or cause failure of circuit board component ball grid arrays (BGA) positioned relatively close to the PCB mounting holes. As a result, the PCB mounting holes require that BGA devices mount to the circuit board at a 0.5 inch radius from the center of each PCB mounting hole to minimize stress on the BGA. Increasing the number of PCB mounting holes in a circuit board, therefore, reduces the amount of real estate on the circuit board available for BGA mounted circuit board components. Furthermore, the stress generated by the conventional fasteners and minimally compliant stand-offs on the circuit board causes the conductive layers (e.g., both grounding and signal carrying layers) to contact each other through the non-conductive layers. Such contact short circuits the signals carried by the layers and, in turn, causes the circuit board to malfunction.

Also as described, certain circuit boards utilize sheets of conductive material, formed into z-shaped clips, to couple the mesh points of the circuit board to a support mount or carrier tray coupled to the circuit board. The z-shaped clip, however, creates an airflow restriction across a surface of the circuit board depending upon the orientation of the z-shaped clip relative to an airflow source. Such restriction can lead to insufficient cooling and possible malfunction of the circuit board.

By contrast, embodiments of the present invention significantly overcome such deficiencies and provide mechanisms for grounding a circuit board. A grounding member support forms an interference or friction fit with an opening defined by the circuit board. A compliant, electrically conductive grounding member couples to the grounding member support. The grounding member electrically couples a grounding layer of the circuit board with a support mount coupled to the circuit board. During assembly, insertion of the grounding member support within the opening defined by the circuit board creates an expansive or lateral force on the opening. Furthermore, during assembly, the support mount compresses the compliant, electrically conductive grounding member against the circuit board. The interference fit between the grounding member support and the opening along with compression of the grounding member between the circuit board and the support mount limits the amount of stress received by a surface of the circuit board. Such limitation of stress, in turn, limits potential damage to components mounted to the circuit board or to conductive layers within the circuit board. Because the grounding member support and grounding member limits the amount of stress directed against the circuit board, an assembler can configure the circuit board with as many grounding member supports and grounding members as necessary to reduce induction of current flow between grounding layer mesh locations of the circuit board without damaging the circuit board components or limiting the location of circuit board components on the circuit board.

In one arrangement, the grounding assembly has a circuit board having a conductive ground plane defining an opening, a grounding member in electrical communication with the ground plane, and a grounding member support forming an interference fit with the opening defined by the circuit board and configured to maintain electrical communication between the grounding member and the ground plane of the circuit board. The grounding member is configured to compressibly engage a support mount substantially parallel to the circuit board to electrically couple the conductive ground plane of the circuit board to the support mount. Compression of the grounding member between the circuit board and the support mount limits the amount of stress generated by the grounding member against the circuit board, thereby limiting potential damage to components mounted to the circuit board or to conductive layers within the circuit board.

In one arrangement, an embodiment of the invention relates to a method for assembling a grounding assembly. In the method, an assembler forms a circuit board having a conductive ground plane and defining an opening. The assembler couples a grounding member support to the circuit board to form an interference fit with the opening defined by the circuit board and to maintain electrical communication between a grounding member and conductive ground plane of the circuit board. The assembler places the grounding member in mechanical communication with the grounding member support and in electrical communication with the conductive ground plane. The grounding member is configured to compressibly engage a support mount substantially parallel to the circuit board to electrically couple the conductive ground plane of the circuit board to the support mount. Compression of the grounding member between the circuit board and the support mount limits the amount of stress generated by the grounding member against the circuit board, thereby limiting potential damage to components mounted to the circuit board or to conductive layers within the circuit board.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION

Embodiments of the present invention provide mechanisms for grounding a circuit board. A grounding member support forms an interference or friction fit with an opening defined by the circuit board. A compliant, electrically conductive grounding member couples to the grounding member support. The grounding member electrically couples a grounding layer of the circuit board with a support mount coupled to the circuit board. During assembly, insertion of the grounding member support within the opening defined by the circuit board creates an expansive or lateral force on the opening. Furthermore, during assembly, the support mount compresses the compliant, electrically conductive grounding member against the circuit board. The interference fit between the grounding member support and the opening along with compression of the grounding member between the circuit board and the support mount limits the amount of stress received by a surface of the circuit board. Such limitation of stress, in turn, limits potential damage to components mounted to the circuit board or to conductive layers within the circuit board. Because the grounding member support and grounding member limits the amount of stress directed against the circuit board, an assembler can configure the circuit board with as many grounding member supports and grounding members as necessary to reduce induction of current flow between grounding layer mesh locations of the circuit board without damaging the circuit board components or limiting the location of circuit board components on the circuit board.

Figure 1:
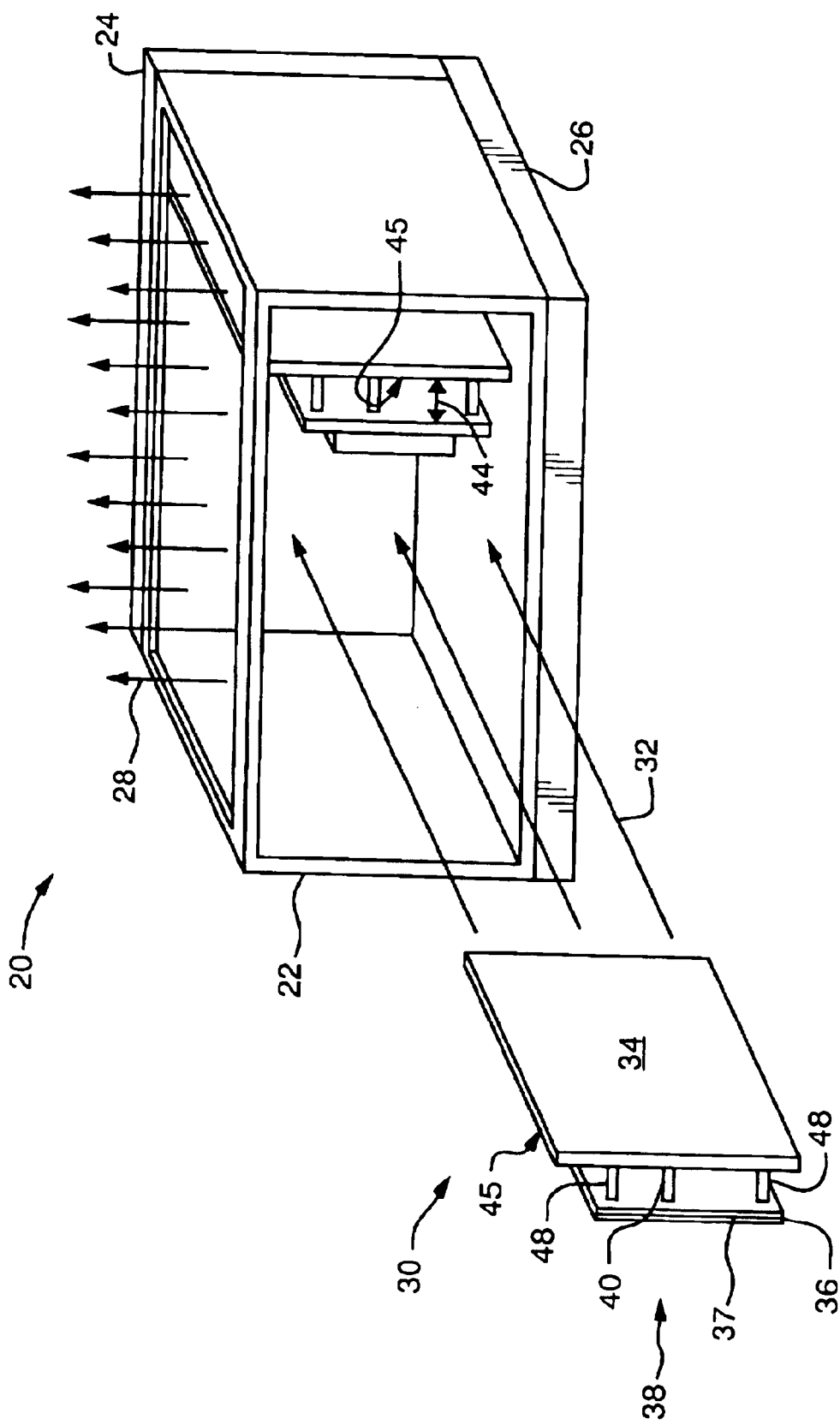
FIG. 1 is a perspective view of a computer system that is suitable for use by the invention.

FIG. 1 shows a computer system 20, suitable for use by the invention. The computer system 20 includes a card cage or chassis 22, a back plane 24, and a fan assembly 26 that provides an air stream 28 that flows through the card cage 22. The system 20 further includes multiple circuit board assemblies 30 which connect with the back plane 24 when installed in the card cage 22 in the direction 32.

Each circuit board assembly 30 includes a support plane or support mount 34, and a grounding assembly 38 formed of a circuit board 36 having a ground plane or ground layer 37, a grounding member 40, and a grounding member support 42 (not shown).

In one arrangement, each support mount 34 includes side portions (e.g. stand-offs) 48 that attach the circuit board 36 to the support mount 34. Each support mount 34 essentially operates as a carrier (e.g., carrier tray) for holding the circuit board 36 in place for proper alignment and connection with the back plane 24. In one arrangement, the support mount 34 includes a metallic material, such as stainless steel, that shields circuitry of the circuit board assembly 30 from external electromagnetic interference (EMI) sources.

Figure 2:
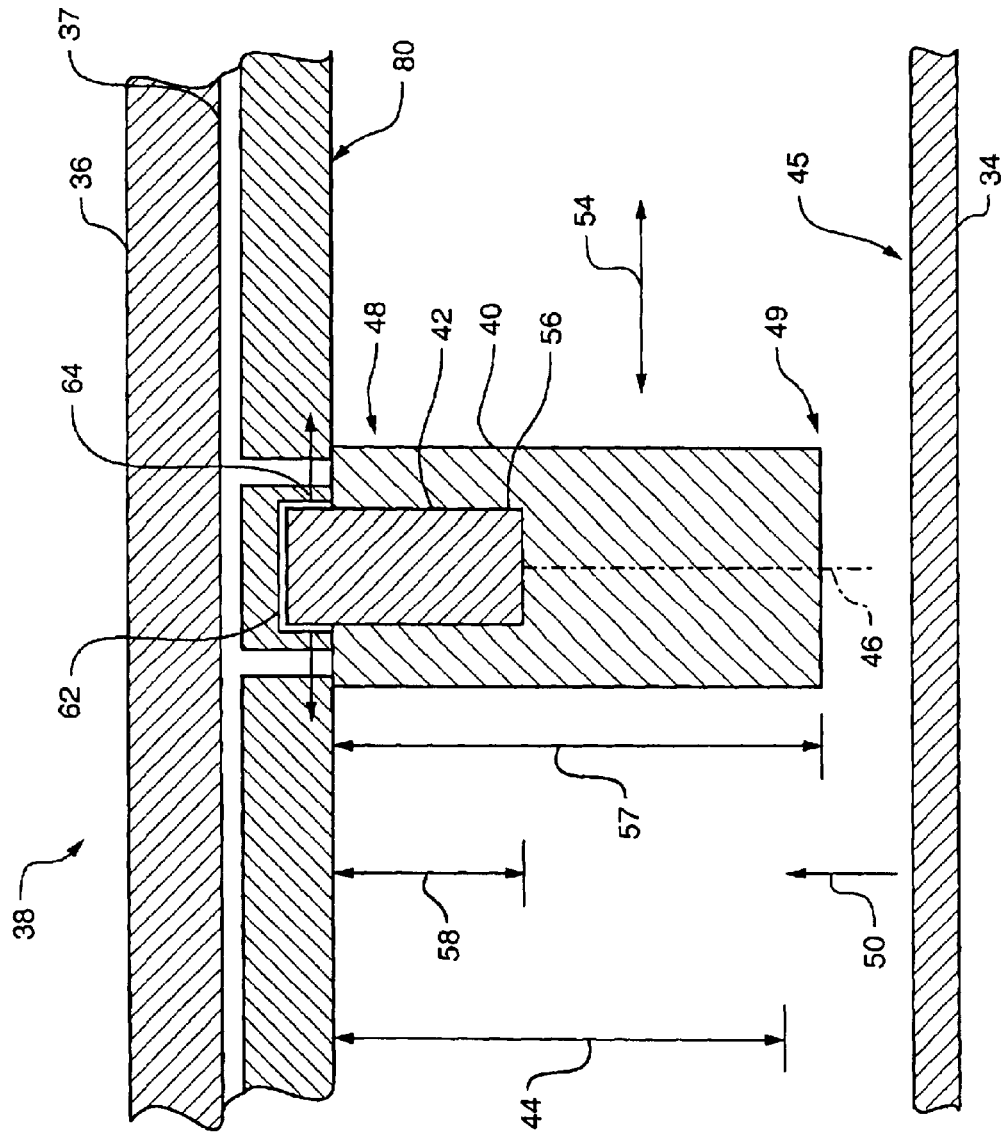
FIG. 2 illustrates a sectional view of a grounding assembly.

FIG. 2 illustrates a sectional view of an arrangement of the grounding assembly 38. As described above, the grounding assembly 38 is formed of the circuit board 36 having the ground plane 37, the grounding member 40, and the grounding member support 42.

The ground plane 37 of the circuit board 36 is a layer formed from a conductive material that carries or conducts a ground signal within the circuit board 36. While FIG. 2 illustrates a single ground plane 37, in one arrangement, the circuit board 36 has multiple ground planes 37. For example, the circuit board 36, in one arrangement, is configured with a logic ground layer, a frame ground layer, and a chassis ground layer. In such an arrangement, the multiple ground planes 37 interconnect at multiple locations (e.g., ground plane mesh locations or isotherms) along the circuit board 36.

The grounding member support 42 couples to the circuit board 36 by way of an opening 62 defined by the circuit board 36. The grounding member support 42 forms an interference or friction fit within the opening 62. Insertion of the grounding member support 42 into the opening 62 compresses the grounding member support 42 and causes the support 42 to generate an expansive or lateral force 64 on the opening 62 (e.g., walls of the opening 62). Compared to conventional attachment mechanisms (e.g., use of a standoff and fastener) use of the grounding member support 42 in conjunction with the opening 62 defined by the circuit board 36 minimizes the force and stress applied to the circuit board 36.

The grounding member support 42 furthermore maintains electrical communication between the grounding member 40 and the ground plane 37 of the circuit board 36. For example, the grounding member support 42 attaches to the circuit board 36 in proximity to the ground plane mesh point on the circuit board 36. As shown in FIG. 2, the grounding member support 42 is configured as a protrusion from the circuit board 36 that forms an interference fit with a cavity 56 defined by the grounding member 40. Such a fit limits lateral movement 54 (e.g., slipping) of the grounding member 40 thereby maintains electrical contact between the grounding member 40 and the ground plane 37.

The grounding member 40 is formed of a compliant, electrically conductive material. For example, the grounding member 40 is a FUZZ BUTTON (Tecknit Interconnection Products), a beryllium copper spring sleeve, or a compliant, electrically conductive polymer (e.g., such as manufactured by Chomerics). In one arrangement, the grounding member 40 maintains compliant material properties over a temperature range between approximately −10° C. and 70° C. In such an arrangement, the grounding member 40 maintains electrical contact between the ground plane 37 and the support mount 34 when exposed to conventional computer system operating temperatures.

The grounding member 40 is configured to electrically couple the ground plane 37 with the support mount 34 to transmit the ground signal carried by the ground plane 37 to the support mount 34. For example, as shown in FIG. 1, the circuit board 36 coupled to the substantially parallel support mount 34 defines a space 44, approximately 5 mm and 7 mm in length, between the circuit board 36 and a surface 45 the support mount 34. The grounding member 40 is oriented between the circuit board 36 and the surface 45 of the support mount 34 within the defined space 44 between the circuit board 36 and the support mount 34. Because the grounding member 40 is formed of the electrically conductive material, the grounding member 40 transmits the ground signal of the ground plane 37 to the support mount 34.

Coupling 50 of the support mount 34 to the circuit board 36 compresses the grounding member 40 along a long axis 46 of the grounding member 40. For example, a manufacturer couples the support mount 34 to the circuit board 36 using conventional stand-offs 48 and fasteners, such as screws. Because the grounding member 40 is formed from a compliant material, compression of the grounding member between the circuit board 36 and the support mount 34 limits the amount of stress generated by the grounding member 40 against a surface 80 the circuit board 36 (e.g., the ground member 40 absorbs the load generated by the support mount 34 on the circuit board 36).

Minimization of stress on a surface 80 of the circuit board 36 by use of the compliant grounding member 40 and the grounding member support 42 limits potential damage to both the circuit board components on the circuit board 36 and the conductive layers within the circuit board 36.

For example, conventional circuit boards utilize stand offs and fasteners, such as screws, to electrically couple the ground plane 37 to the support mount 34. In such a configuration, the stand offs and fasteners generate a relatively large stress on the circuit board. Circuit board components attached to the circuit board using BGA's, therefore, must maintain a distance of at least 9.5 mm (0.5 inches) from the standoff to minimize fracturing of the BGA caused by the generated stress. By contrast, use of the compliant grounding member 40 and the grounding member support 42 minimizes the stress applied to the surface 80 of the circuit board (e.g., the stress generated by the grounding member 40 and the grounding member support 42 relative to the circuit board surface 80 is less than the stress required to fracture solder elements of a BGA-attached circuit board component). Such a configuration allows a manufacturer to attach the grounding member 40 and grounding member support 42 to the circuit board 36 in relative proximity (e.g., within less than approximately 9.5 mm) to a BGA component coupled to the circuit board without damaging (e.g., fracturing) the BGA coupling.

In another example, conventional circuit boards are formed of multiple conductive layers and nonconductive layers. Conventional stand-offs and fasteners generate relatively high stresses on the circuit board, thereby causing adjoining conductive surfaces to come into contact or short circuit. By contrast, use of the grounding member support 42 and compliant grounding member 40 to couple the ground plane 37 of the circuit board 36 with the support mount 34 limits the stress generated on the surface 80 of the circuit board 36 and, therefore, minimizes the potential of short circuiting the conductive layers within the circuit board 36.

In one arrangement, a length 57 of the grounding member 40 is between approximately 110% and 120% of the length of the space 44 between the circuit board 36 and the support mount 34. Because the length of the grounding member 40 is greater than the length of the space 44, when the support mount 34 attaches to the circuit board 36, the support mount 34 contacts and compresses the grounding member 40 against the circuit board 36. The compliance of the grounding member 40 absorbs compressive forces generated by the support mount 34 against the circuit board 36 by deforming a first end 48 of the grounding member 40 against the circuit board 36 and by deforming a second end 49 of the grounding member 40 against the support mount 34. Such deformation, in turn, maintains electrical contact between the grounding member 40 and the ground plane 37 and between the grounding member 40 and the support mount 34 during operation of the circuit board assembly 30. For example, in the case where the circuit board assembly 30 experiences a vibrational force, the deformed first 48 and second 49 ends of the grounding member 40 maintains electrical contact between the ground plane 37 and the support mount 34.

In one arrangement, a length 58 of the grounding member support 42 is between approximately 50% and 70% of the length of the space 44 between the circuit board 36 and the support mount 34. By minimizing the length 58 of the grounding member support 42 relative to the length of the space 44, when the support mount 34 attaches to the circuit board 36 the grounding member support 42 does not directly contact the support mount 34. Elimination of direct contact between the support mount 34 and the ground member support 42 minimizes axial loading of the grounding member support 42 by the support mount 34. Such a configuration limits stress generated by the grounding member support 42 on the surface 80 of the circuit board 36. By limiting stress on the surface of the circuit board 36 the relative geometry of the length 58 of the grounding member support 42 and the space 44 minimizes damage to components attached to the circuit board (e.g., minimizes damage to a ball grid array (BGA) connecting an ASIC to the circuit board 36).

Figure 3:
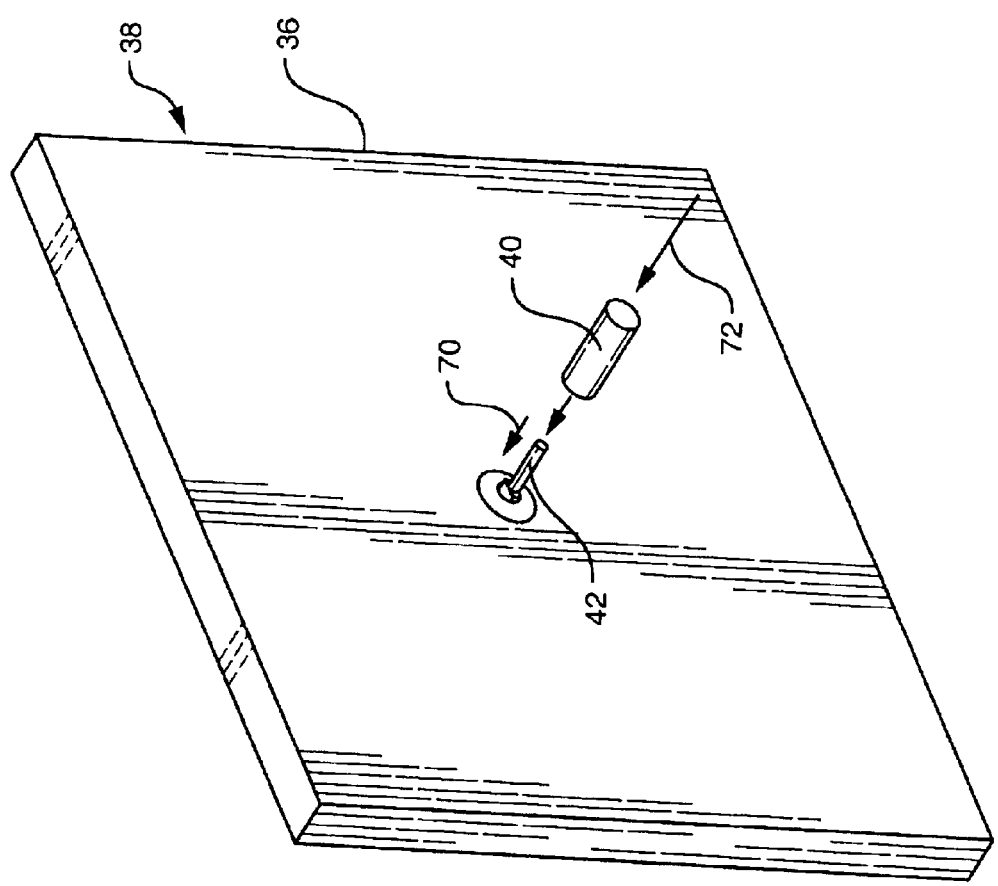
FIG. 3 illustrates an exploded perspective view of a grounding assembly, according to one embodiment of the invention.

FIG. 3 illustrates one arrangement of the grounding assembly 38 where the grounding member 40 and the grounding member support 42 are removably attached to the circuit board 36. For example, during manufacture of the grounding assembly 38, an assembler (e.g., a technician or an automated device) attaches the grounding member support 42 to the circuit board 36, along a direction 70, using an interference or friction fit between the circuit board 36 and the grounding member support 42. The assembler also attaches 72 the grounding member 40 to the circuit board 36, along direction 72, using an interference or friction fit between the grounding member support 42 and the grounding member 40.

Removable attachment of the grounding member support 42 and the grounding member 40 to the circuit board 36 allow the assembler to selectively populate the circuit board 36 with grounding member supports 42 and grounding members 40 on an "as needed" basis, thereby lowering the manufacturing costs of the circuit board 36. For example, as the operating frequency of the circuit board components (e.g., ASIC's) of the circuit board 36 increases, the distance between grounding locations on the circuit board -1236 decreases. Therefore, for a circuit board 36 having circuit board components operating at a relatively high frequency, the assembler attaches a relatively large number of the grounding member supports 42 and the grounding members 40 to the circuit board 36. For a circuit board 36 having circuit board components operating at a relatively low frequency, the assembler attaches a relatively small number of the grounding member supports 42 and the grounding members 40 to the circuit board 36. Because the grounding member supports 42 and the grounding members 40 are removably attached to the circuit board 36, the assembler can add or remove grounding member supports 42 and the grounding members 40, based upon the requirements of a particular circuit board, to save costs (e.g., cost of goods sold) related to manufacturing of the circuit board 36.

Figure 4:
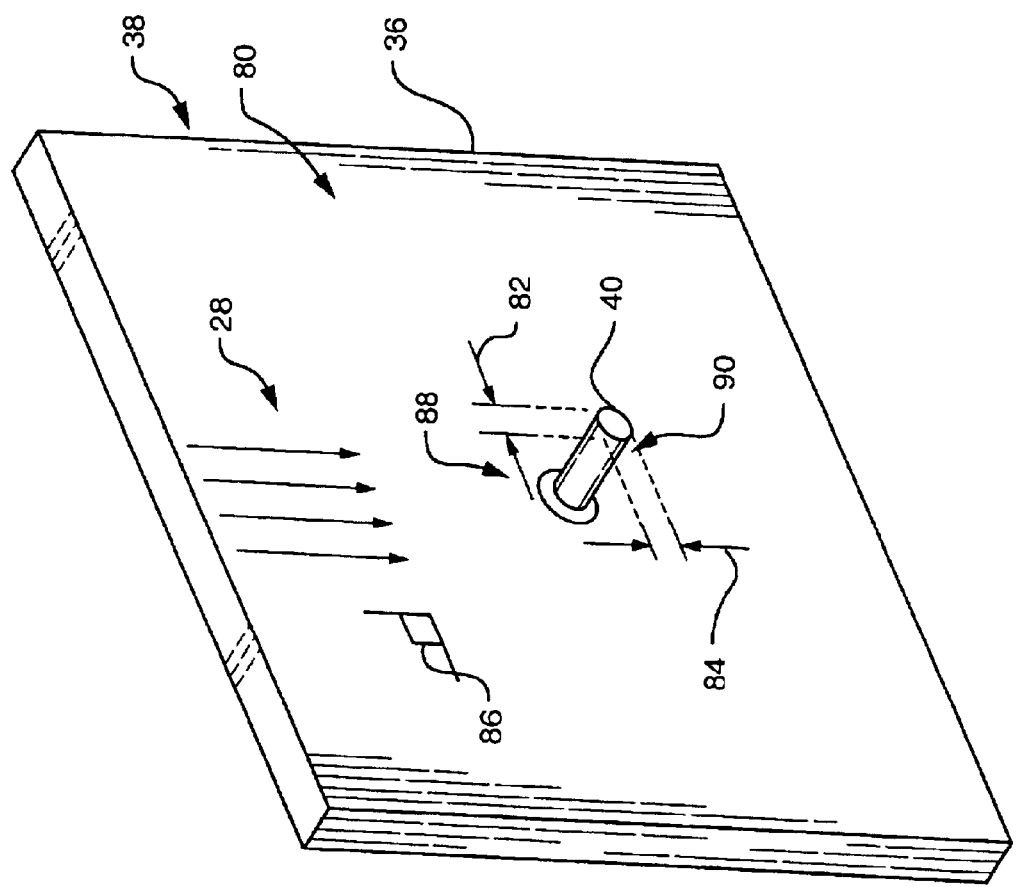
FIG. 4 illustrates an assembled perspective view of the grounding assembly of FIG. 3, according to one embodiment of the invention.

FIG. 4 illustrates an arrangement of the grounding assembly 38 where the grounding member 40 is configured to minimize an airflow 28 restriction across the surface 80 of the circuit board 36, regardless of the orientation of the grounding member 40 relative to an airflow source. In such an arrangement, the grounding member 40 defines a first profile area or surface area 82 along a first grounding member orientation 88 configured to contact to an airflow 28. The grounding member 40 furthermore defines a second profile area or surface area 84 along a second grounding member orientation 90 configured to contact to an airflow 28 where the first profile area 82 and the second profile area 84 are substantially equal. Because the first profile area 82 and the second profile area 84 of the grounding member 40 are substantially equal, the grounding member 40 provides the same, minimal airflow restriction on airflow 28, regardless of the orientation of the grounding member 40 (e.g., regardless of exposure of either the first profile area or the second profile area) relative to an airflow source, such as a fan assembly 26.

For example, in one arrangement, the grounding member 40 is configured as a cylinder where the first profile area 82 is orthogonal 86 to the second profile area 84. During assembly, therefore the orientation of the grounding member 40 (e.g., orientation of either the first profile area 82 or the second profile area 84) relative to the airflow 28 does not affect or impinge the airflow 28 across the circuit board 36. Because the first profile area 82 and the second profile area 84 of the grounding member 40 are substantially equivalent, during assembly, the manufacturer can assemble the grounding assembly 38 without aligning the grounding assembly 40 with an airflow orientation relative to the circuit board. The use of a grounding assembly having a substantially equivalent first profile area 82 and the second profile area 84, therefore, reduces circuit board assembly time and, therefore, reduces the cost for manufacturing the circuit board 36.

Figure 5:
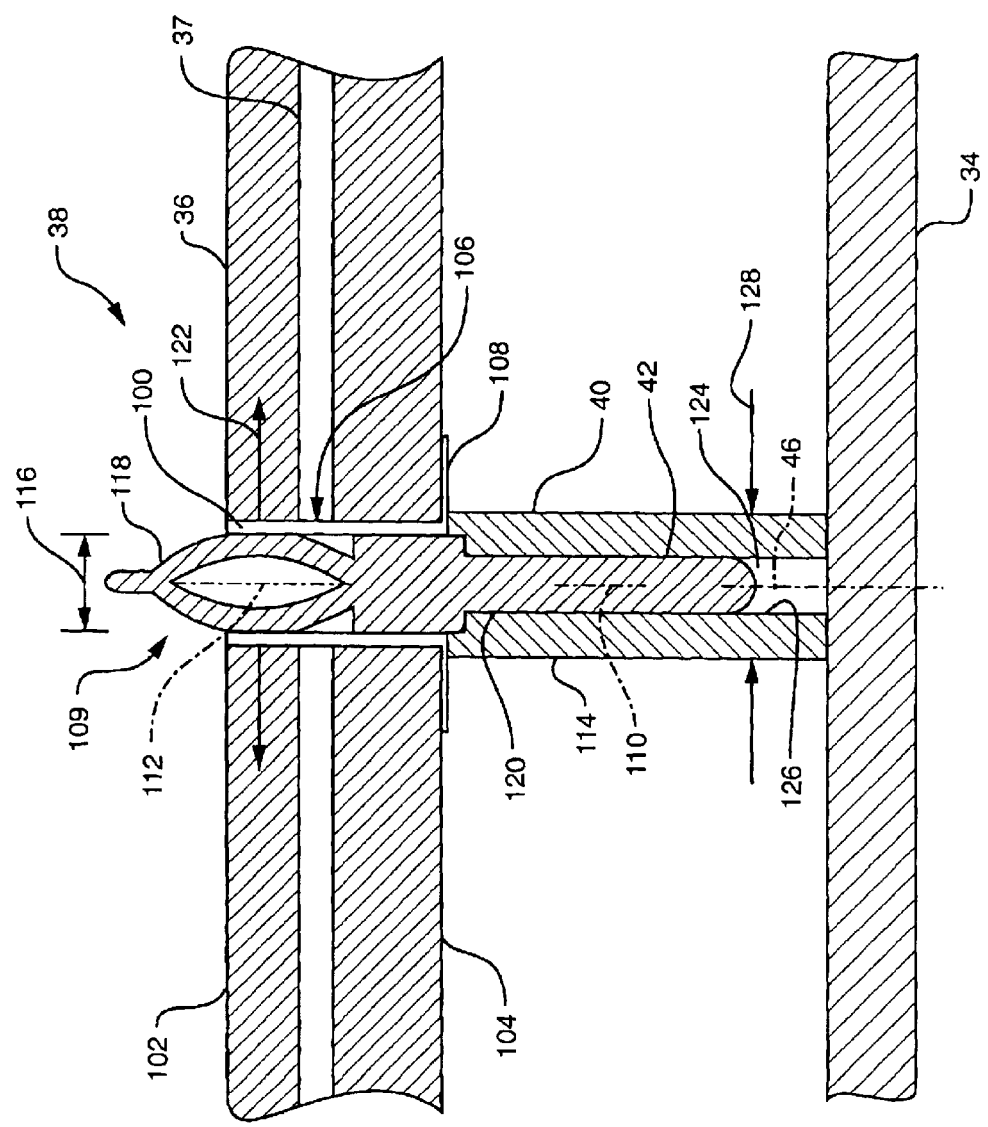
FIG. 5 illustrates a sectional view of a grounding assembly.

FIG. 5 illustrates an arrangement of the grounding assembly 38 illustrated in FIG. 2. The grounding assembly 38 shown in FIG. 5 provides electrical contact between the ground plane 37 and the support mount 34 via the grounding member 40. In the grounding assembly 38 illustrated, the circuit board 36 defines a plated through hole 100, the grounding member support 42 in configured as a pin 109 for insertion into the plated through hole 100, and the grounding member 40 is configured as a compliant, electrically conductive sheath 114 configured to attach to the pin 109 and electrically couple the ground plane 37 of the circuit board 36 to the support mount 34.

In the arrangement shown in FIG. 5, the circuit board 36 defines the plated through hole 100 (e.g., opening 62) as extending from a first surface 102 of the circuit board 36 to the second surface 104 of the circuit board 36 where the plated through hole 100 is in electrical communication with the ground plane 37. Such a configuration allows insertion of an electrically conductive grounding member support 42 within the plated through hole 100. In one arrangement, the plated material of the plated through hole is formed from a nickel silver material. Contact 106 between the electrically conductive grounding member support 42 and the plated through hole 100 electrically couples the electrically conductive grounding member support 42 and the ground plane 37.

In one arrangement, the plated through hole 100 extends onto the second surface 104 of the circuit board 36 to form a contact pad 108. The contact pad 108 is configured to provide an electrical contact location for the grounding member 40 to couple the ground plane 37 with the support mount 34.

The grounding member support 42, as illustrated, is a pin 109 having a long axis 110 substantially aligned with a long axis 112 of the plated through hole 100. The alignment of axes 110, 112 orients the pin 109 orthogonally relative to the second surface 104 of the circuit board 36. Orthogonal orientation of the pin 109 relative to the second surface 104 of the circuit board 36, in turn, orients the grounding member 40 toward the support mount 34 to provide electrical communication between the grounding member 40 and the support mount 34. The grounding member support 42 is also in electrical communication with the plated through hole 100. The electrical communication between the plated through hole 100 and the grounding support member 42 allows the grounding support member 42 to direct the ground signal, carried by the ground plane 37, from the plated through hole 100 to the ground member 40.

In one arrangement, the pin 109 is an eye-of-the-needle pin (e.g., such as manufactured by Molex Inc., Lisle, Ill.) having a head portion 118 and a shaft portion 120. The head portion 118 has an eye outer length 116 greater than the inner diameter of the plated through hole 100. Insertion of the head portion 118 of the eye-of-the-needle pin 109 within the plated through hole 100 compresses the head portion 118 of the pin 109. Such compression causes the head portion 118 to generate an expansive or lateral force 64 on the plated through hole 100 to form an interference fit with the plated through hole 100. The lateral force 64 generated by the pin 109 maintains contact between the pin 109 and the plated through hole 100 and minimizes load generated on either the first surface 102 or the second surface 104 of the circuit board 36. The lateral force 64, therefore, minimizes damage to circuit board components carried by either surface 102, 104 of the circuit board 36 in proximity to the plated through hole 100.

With reference still made to FIG. 5, the grounding member 40, as illustrated, is a compliant, electrically conductive sheath 114 in electrical communication with the pin 108. The sheath 114 is configured to compressibly engage the support mount 34 to electrically couple the ground plane 37 of the circuit board 36 to the support mount 34. In one arrangement, the sheath 118 is a compliant, electrically conductive, polymer (e.g., such as manufactured by Chomerics).

The sheath 114, in one arrangement, defines, along a long axis 46 of the sheath 114, a sheath opening 124 having a sheath wall 126. The long axis 46 of the sheath 114 is substantially aligned with the long axis 110 of the pin 109 and the sheath wall 126 is in electrical communication with the pin 109. In such a configuration, the sheath 114 opening inserts over the shaft portion 120 of the pin 109. In one arrangement, the outer diameter of the shaft 120 is greater then the inner diameter of the sheath opening 124. Placement of the sheath 114 over the shaft 120 of the pin 109 forms an interference fit between the pin 109 and the sheath 114, thereby minimizing vertical movement of the sheath 118 along the long axis 110 of the shaft 110 and maintaining electrical contact between the sheath 118, the pin 109 and the support mount 34.

In one arrangement, the sheath 114 defines an outer profile length 128 (e.g., diameter) between approximately 2.0 mm and 3.5 mm. The relatively small outer profile length 128 of the sheath 114 allows a circuit board manufacturer to manufacture the circuit board 36 with relatively small diameter plated through holes 100 (e.g., less than between approximately 2.0 mm and 3.5 mm in diameter) corresponding to the outer profile length 128 of the sheath 114. Such relatively small diameter plated through holes 100 utilize minimal real estate on the surface 102 of the circuit board 36, thereby requiring relatively smaller keep out regions on the circuit board 36 for placement of circuit board components or traces on the circuit board 36. In turn, the relatively small diameter plated through holes 100 provides a greater flexibility for placement of traces on the circuit board 36. Furthermore, because of the relatively small size of the plated through holes 100, a manufacturer can produce a circuit board 36 having a relatively large number of grounding assemblies 38 (e.g., plated through holes, pins 109, and sheaths 114) to allow for grounding of high frequency circuit board components while utilizing minimal real estate on the surfaces 102, 104 of the circuit board 36.

Figure 6:
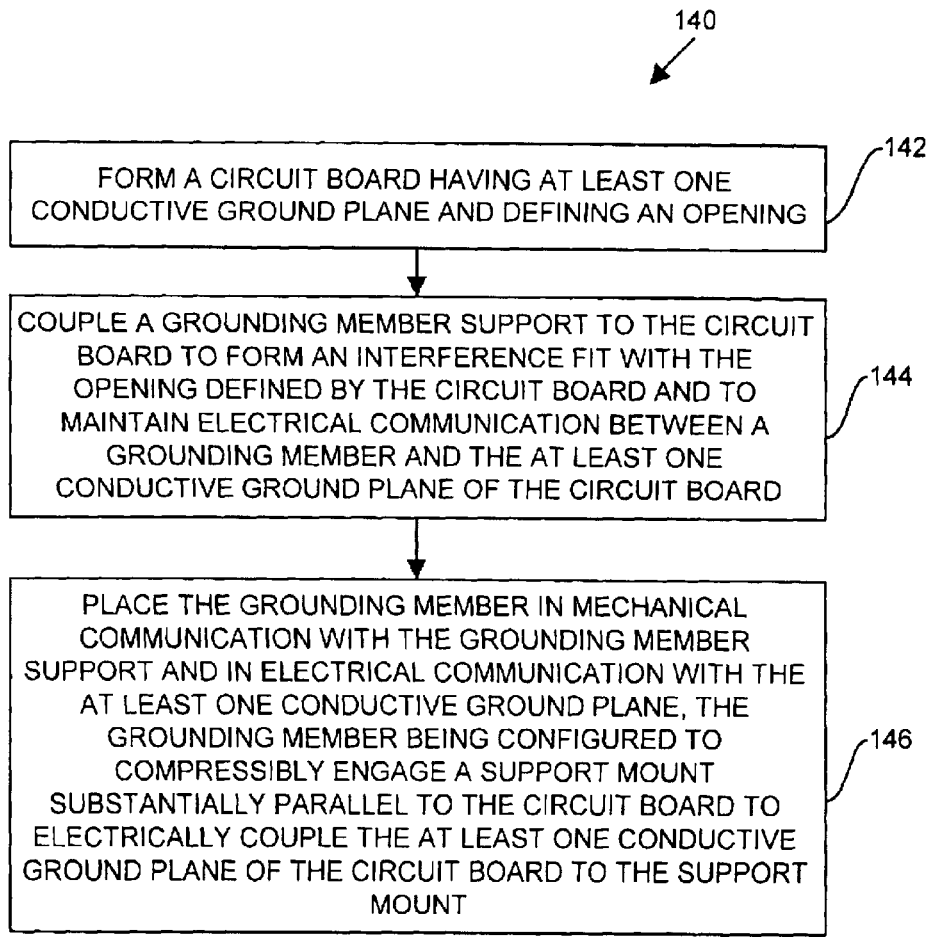
FIG. 6 illustrates a flowchart of a procedure for assembling a circuit board assembly, according to one embodiment of the invention.

FIG. 6 illustrates a flowchart for a method 140 of assembling a circuit board assembly 30. Such a method can be performed either manually (e.g., by a technician on an assembly line) or automatically (e.g., by automated equipment).

In step 142, an assembler forms a circuit board 36 having a conductive ground plane 37 and defining an opening 62. For example, the assembler laminates layers of conductive and non-conductive material to form the circuit board 36. The manufacturer, in one arrangement utilizes multiple conductive layers as ground planes 37 in the circuit board 36 and interconnects the ground planes 37 at mesh locations on the circuit board (e.g., at plated through hole 100 locations on the circuit board 36).

In step 144, the assembler couples a grounding member support 42 to the circuit board 36 board to form an interference fit with the opening 62 defined by the circuit board 36 and to maintain electrical communication between a grounding member 40 and the conductive ground plane 37 of the circuit board 36.

In step 146, the assembler places the grounding member 40 in mechanical communication with the grounding member support 42 and in electrical communication with the ground plane 37. The grounding member 40 is configured to compressibly engage a support mount 34 substantially parallel to the circuit board to electrically couple the conductive ground plane 37 of the circuit board 36 to the support mount 34.

In one arrangement, the assembler couples the grounding member support 42 in removable communication with the circuit hoard 36 and places the grounding member 40 in removable electrical communication with the conductive ground plane 37 of the circuit board 36. Such removable placement of the grounding member support 42 and the grounding member 40 allows the assembler to selectively populate the circuit board 36 with grounding member supports 42 and grounding members 40 on an "as needed" basis, thereby lowering the manufacturing costs of the circuit board 36.

In one arrangement, the assembler forms the circuit board 36 as defining a first surface 102, a second surface 104 opposing the first surface 102, and a plated through hole 100 extending from the first surface 102 of the circuit board 36 to the second surface 104 of the circuit board 36 where the conductive ground plane 37 of the circuit board 36 is in electrical communication with the plated through hole 100. In such an arrangement, the assembler electrically couples (e.g., forms an interference fit between) a pin 109 with the plated through hole 100 where the pin has a long axis 110 substantially aligned with a long axis 112 of the plated through hole 100. The assembler also places a compliant, electrically conductive sheath 114 in electrical communication with the pin, the compliant, electrically conductive sheath 114 configured to compressibly engage a support mount 34 to electrically couple the ground plane 37 of the circuit board 36 to the support mount 36.

In one arrangement, when placing the compliant, electrically conductive sheath 114 in electrical communication with the pin 109, the assembler aligns a sheath opening 124, defined along a long axis 46 of the sheath 114, with the long axis 110 of the pin 109. The assembler places a sheath wall 126, defining the sheath opening 124, in electrical communication with the pin 109. Such placement forms a friction fit between the pin 109 and the sheath 114, thereby minimizing slipping or movement of the sheath 114 relative to the pin 109.

Those skilled in the art will understand that there can be many variations made to the embodiments explained above while still achieving the same objective of those embodiments and the invention in general.

For example, FIG. 5 illustrates the sheath 114 as electrically contacting the ground plane 37 of the circuit board 36 by electrically contacting the contact pad 108 of the plated through hole 100 and by electrically contacting the pin 109 that electrically contacts the ground plane 37 via the plated through hole 100. Such electrical contact between the grounding member 40 and the ground plane 37 is by way of example only. In one arrangement, the plated through hole 100 does not have a contact pad 108. In such an arrangement, the plated through hole 100 electrically contacts the ground plane 37, the pin 109 electrically contacts the plated through hole 100 and the sheath 114 electrically contacts the pin 109. In such a configuration, the sheath 114 carries the ground signal of the ground plane to the support mount 34 without directly contacting the plated through hole 100.

In another example, FIG. 5 illustrates the pin 109 as having a head 118 configured as an eye-of-the-needle. In such an arrangement, insertion of the head 118 into the plated through hole 100 compresses the head and causes the head to create an expansive (e.g., lateral) force on the plated through hole 100. Such an arrangement is by way of example only. In another arrangement, the head 118 of the pin 109 is configured as a Winchester barrel (e.g., a hollow, non-continuous cylindrical barrel). In such an arrangement, insertion of Winchester barrel into the plated through hole 100 compresses deforms the Winchester barrel and causes the Winchester barrel to generate an expansive (e.g., lateral) force on the plated through hole 100. Such force causes the Winchester barrel to maintain mechanical and electrical contact with the plated through hole 100.

In another example, the grounding member 40, as described above is formed of a compliant, electrically conductive material such as a FUZZ BUTTON (Tecknit Interconnection Products), a beryllium copper spring sleeve, or a compliant, electrically conductive polymer (e.g., such as manufactured by Chomerics). In one arrangement, the grounding member 40 is formed of a compliant, electrically conductive material that minimizes generation of a chemical reaction when placed in contact with the grounding member support 42 or the plated through hole 100. For example, certain materials, when placed in relatively close proximity, undergo a chemical reaction that causes a flow of ions from one material to the other, thereby forming a battery. Such a "battery effect" impacts operation of the circuit board 36. To minimize creation of such a "battery affect" grounding member 40 is formed of a material that minimizes generation of a chemical reaction when placed in contact with the grounding member support 42 or the plated through hole 100.

Such variations are intended to be covered by the scope of this invention. As such, the foregoing description of embodiments of the invention is not intended to be limiting. Rather, any limitations to the invention are presented in the following claims.

What is claimed is:

1. A grounding assembly comprising:
   a circuit board having at least one conductive ground plane and defining an opening;
   a grounding member in electrical communication with the at least one conductive ground plane, the grounding member being configured to compressibly engage a support mount substantially parallel to the circuit board to electrically couple the at least one conductive ground plane of the circuit board to the support mount; and
   a grounding member support forming an interference fit with the opening defined by the circuit board and configured to maintain electrical communication between the grounding member and the at least one conductive ground plane of the circuit board.

2. The grounding assembly of claim 1 wherein the grounding member defines a first profile area, along a first grounding member orientation, configured to contact to an airflow and defines a second profile area, along a second grounding member orientation, configured to contact to the airflow, the first profile area and the second profile area being substantially equal.

3. The grounding assembly of claim 1 wherein the grounding member is in removable electrical communication with the at least one conductive ground plane of the circuit board.

4. The grounding assembly of claim 1 wherein the grounding member support is removably coupled with the circuit board.

5. The grounding assembly of claim 1 wherein:
   the circuit board defines a first surface, a second surface opposing the first surface, and at least one plated through hole extending from the first surface of the circuit board to the second surface of the circuit board, the conductive ground plane in electrical communication with the at least one plated through hole;
   the grounding member support comprises a pin in electrical communication with the at least one plated through hole, the pin having a long axis substantially aligned with a long axis of the at least one plated through hole; and
   the grounding member comprises a compliant, electrically conductive sheath in electrical communication with the pin, the sheath configured to compressibly engage a support mount to electrically couple the at least one ground plane of the circuit board to the support mount.

6. The grounding assembly of claim 5 wherein the sheath defines, along a long axis of the sheath, a sheath opening having a sheath wall, the sheath opening substantially aligned with the long axis of the pin and the sheath wall in electrical communication with the pin, the sheath defining an outer profile length of between approximately 2.0 mm and 3.5 mm.

7. A circuit board assembly comprising:
   a circuit board having at least one conductive ground plane and defining an opening;
   a support mount substantially parallel to and coupled with the circuit board, the circuit board and a surface of the support mount defining a space between the circuit board and the support mount;
   a grounding member in electrical communication with the at least one conductive ground plane, the grounding member compressibly engaging the surface of the support mount, within the space between the circuit board and the support mount, to electrically couple the at least one conductive ground plane of the circuit board to the support mount; and a grounding member support forming an interference fit with the opening defined by the circuit board and configured to maintain electrical communication between the grounding member and the at least one conductive ground plane of the circuit board.

8. The circuit board assembly of claim 7 wherein the grounding member defines a first profile area along a first airflow orientation relative to the circuit board and defines a second profile area along a second airflow orientation relative to the circuit board, the first profile area and the second profile area being substantially equal.

9. The circuit board assembly of claim 7 wherein the grounding member is in removable electrical communication with the at least one conductive ground plane of the circuit board.

10. The circuit board assembly of claim 7 wherein the grounding member support is removably coupled with the circuit board.

11. The circuit board assembly of claim 7 wherein:
the circuit board defines a first surface, a second surface opposing the first surface, and at least one plated through hole extending from the first surface of the circuit board to the second surface of the circuit board, the conductive ground plane in electrical communication with the at least one plated through hole;
the grounding member support comprises a pin in electrical communication with the at least one plated through hole, the pin having a long axis substantially aligned with a long axis of the at least one plated through hole; and
the grounding member comprises a compliant, electrically conductive sheath in electrical communication with the pin, the sheath configured to compressibly engage a support mount to electrically couple the at least one ground plane of the circuit board to the support mount.

12. The circuit board assembly of claim 11 wherein the sheath defines, along a long axis of the sheath, a sheath opening having a sheath wall, the sheath opening substantially aligned with the long axis of the pin and the sheath wall in electrical communication with the pin, the sheath defining an outer profile length of between approximately 2.0 mm and 3.5 mm.

13. A method for assembling a grounding assembly comprising the steps of:
forming a circuit board having at least one conductive ground plane and defining an opening;
coupling a grounding member support to the circuit board to form an interference fit with the opening defined by the circuit board and to maintain electrical communication between a grounding member and the at least one conductive ground plane of the circuit board; and
placing the grounding member in mechanical communication with the grounding member support and in electrical communication with the at least one conductive ground plane, the grounding member being configured to compressibly engage a support mount substantially parallel to the circuit board to electrically couple the at least one conductive ground plane of the circuit board to the support mount.

14. The method of claim 13 wherein the step of placing comprises placing the grounding member in removable electrical communication with the at least one conductive ground plane of the circuit board.

15. The method of claim 13 wherein the step of coupling the grounding member support comprises the step of removably coupling the grounding member support to the circuit board.

16. The method of claim 13 further comprising the steps of:
defining a first profile area of the grounding member relative to a first airflow orientation along the circuit board; and
defining a second profile area of the grounding member relative to a second airflow orientation along the circuit board, the first profile area and the second profile area being substantially equal.

17. The method of claim 13 wherein:
the step of forming comprises the step of forming a circuit board defining a first surface, a second surface opposing the first surface, and at least one plated through hole extending from the first surface of the circuit board to the second surface of the circuit board, the conductive ground plane in electrical communication with the at least one plated through hole;
the step of coupling comprises the step of coupling a pin in electrical communication with the at least one plated through hole, the pin having a long axis substantially aligned with a long axis of the at least one plated through hole; and
the step of placing comprises the step of placing a compliant, electrically conductive sheath in electrical communication with the pin, the compliant, electrically conductive sheath configured to compressibly engage the support mount to electrically couple the at least one ground plane of the circuit board to the support mount.

18. The method of claim 17 wherein the step of placing a compliant, electrically conductive sheath in electrical communication with the pin comprises the steps of
substantially aligning a sheath opening, defined along a long axis of the sheath, with the long axis of the pin; and
placing a sheath wall, defining the sheath opening, in electrical communication with the pin, the compliant, electrically conductive sheath defining an outer profile length of between approximately 2.0 mm and 3.5 mm.

19. The method of claim 15 further comprising the steps of:
coupling the support mount to the circuit board, the circuit board and a surface of the support mount defining a space between the circuit board and support mount; and
compressing the grounding member between the surface of the support mount and the circuit board to electrically couple the ground plane of the circuit board to the support mount.

20. A computer system comprising:
a frame;
an air stream source coupled to the frame; and
at least one circuit board assembly coupled to the frame, the circuit board assembly having:
a circuit board having at least one conductive ground plane and defining an opening;
a support mount substantially parallel to and coupled with the circuit board, the circuit board and a surface of the support mount defining a space between the circuit board and the support mount;
a grounding member in electrical communication with the at least one conductive ground plane, the grounding member compressibly engaging the surface of the support mount, within the space between the circuit board and the support mount, to electrically couple the at least one conductive ground plane of the circuit board to the support mount; and a grounding member support forming an interference fit with the opening defined by the circuit board and configured to maintain electrical communication between the grounding member and the at least one conductive ground plane of the circuit board.

21. A grounding assembly comprising:

a circuit board means having at least one conductive ground plane and defining an opening;

a grounding member means in electrical communication with the at least one conductive ground plane, for compressibly engaging a support mount substantially parallel to the circuit board to electrically couple the at least one conductive ground plane of the circuit board to the support mount; and a grounding member support means forming an interference fit with the opening defined by the circuit board for maintaining electrical communication between the grounding member and the at least one conductive ground plane of the circuit board.

22. The circuit board assembly of claim 7 wherein support mount comprises a carrier tray configured to align the circuit board within a card cage.

23. The grounding assembly of claim 1 wherein the grounding member support is configured to generate a substantially lateral force on the opening defined by the circuit board.

24. The circuit board assembly of claim 7 wherein the grounding member support is configured to generate a substantially lateral force on the opening defined by the circuit board.

25. The method of claim 13 wherein the step of coupling a grounding member support to the circuit board to form an interference fit with the opening defined by the circuit board comprises coupling a grounding member support to the circuit board to generate a substantially lateral force on the opening defined by the circuit board.

26. The grounding assembly of claim 1 wherein:

the grounding member support comprises a pin in electrical communication with the at least one plated through hole, the pin having a shaft extending from the at least one plated through hole, relative to a surface of the circuit board, and having a long axis substantially perpendicular to the surface of the circuit board; and the grounding member comprises a compliant, electrically conductive sheath in electrical communication with the pin, the sheath configured to compressibly engage a support mount to electrically couple the at least one ground plane of the circuit board to the support mount.

27. The circuit board assembly of claim 7 wherein:

the grounding member support comprises a pin in electrical communication with the at least one plated through hole, the pin having a shaft extending from the at least one plated through hole, relative to a surface of the circuit board, and having a long axis substantially perpendicular to the surface of the circuit board; and the grounding member comprises a compliant, electrically conductive sheath in electrical communication with the pin, the sheath configured to compressibly engage a support mount to electrically couple the at least one ground plane of the circuit board to the support mount.

* * * * *